United States Patent [19]

Chu et al.

[11] Patent Number: 6,052,008
[45] Date of Patent: Apr. 18, 2000

[54] GENERATION OF TRUE AND COMPLEMENT SIGNALS IN DYNAMIC CIRCUITS

[75] Inventors: Sam Gat-Shang Chu; Visweswaya Rao Kodali; Michael Ju Hyeok Lee, all of Austin, Tex.

[73] Assignee: International Business Machines Corporation, Armonk, N.Y.

[21] Appl. No.: 08/892,861

[22] Filed: Jul. 14, 1997

[51] Int. Cl.[7] ............................................. H03K 19/096
[52] U.S. Cl. ............................. 327/200; 327/211; 326/98
[58] Field of Search ................................ 326/93, 95, 98; 327/200, 201, 208, 209, 210, 211, 212, 218

[56] References Cited

U.S. PATENT DOCUMENTS

| | | | |
|---|---|---|---|
| 5,065,048 | 11/1991 | Asai et al. | 326/98 |
| 5,117,133 | 5/1992 | Luebs | 326/55 |
| 5,148,391 | 9/1992 | Zagar | 365/96 |
| 5,821,775 | 10/1998 | Mehta et al. | 326/98 |
| 5,867,038 | 2/1999 | Kartschoke et al. | 326/45 |

FOREIGN PATENT DOCUMENTS 2-57012   2/1990   Japan ....................... 326/98

OTHER PUBLICATIONS

"Power Saving latch", IBM Technical Disclosure Bulletin, vol. 39, No. 04, Apr. 1996, pp. 65–66.

*Primary Examiner*—Tuan T. Lam
*Attorney, Agent, or Firm*—Kelly K. Kordzik; Winstead Sechrest & Minick P.C.; Anthony V. S. England

[57] ABSTRACT

A logic circuit includes an inverter for generating a complement of an output signal from another logic circuit for input to a dynamic logic circuit. The dynamic logic circuit is capable of receiving both the complement signal and dynamic input signals during both the precharge and evaluate phases of the dynamic logic circuit. The complement signal is permitted to switch from both a low level to a high level and a high level to a low level during such stages with the dynamic logic circuit still capable of correctly evaluating the implemented logical operation of the dynamic logic circuit on the complement signal and the dynamic input signals. A p-channel FET is coupled between the internal precharge node and a voltage reference source where the gate electrode of the p-channel FET device receives the complement signal. Such a configuration eliminates the need for duplicate circuitry necessary to generate the complement signal for use by the dynamic logic circuit and also eliminates the addition of clock skew necessary to prevent potential false switching when using a complement signal generated by simple inversion.

13 Claims, 5 Drawing Sheets

GENERATION OF TRUE AND COMPLEMENT SIGNALS IN DYNAMIC CIRCUITS

TECHNICAL FIELD OF THE INVENTION

The present invention relates in general to data processing systems and, in particular, to dynamic logic circuitry.

BACKGROUND OF THE INVENTION

A logic circuit is a circuit designed to perform a particular logical function based on the concepts of "and," "either-or," "neither-nor," etc. Normally, these circuits operate between two discreet voltage levels, i.e., high and low logic levels, and are described as binary logic circuits. Binary logic circuits are the basic building blocks of data processing systems and almost any electronic computing device. Binary logic circuits are extensively used in computers to carry out instructions and arithmetic processes. Any logical procedure may be effected by using a suitable combination of these basic gates. Because of their low power dissipation, complementary metal-oxide semiconductor (CMOS) field-effect transistors (FETs) are often used to construct such logic circuits.

Logic circuits are often cascaded in a plurality of connected stages. As a result, clock pulses are applied to the elements of a logic circuit to effect logical operations, i. e., drive the logical circuit. Referring now to FIG. 1, there is illustrated a typical logic circuit 100, which may implement any logical function, having Data In inputs and a Data Out output. A Clock signal is input to the logic circuit 100 in order to drive the Data In inputs through the logic circuit 100 and effect the associated logical function implemented in the logic circuit 100 upon the inputs to arrive at the logical solution, which is output as Data Out. The Clock signal also serves to prepare, or precharge, the logic circuit 100 so that it is ready for the next series of Data In inputs subsequent to outputting the previous Data Out.

Referring now to FIG. 2, there is illustrated, in block diagram form, a plurality of dynamic logic circuits 200, 202 and 204 coupled in some type of combination, such as the shown series combination (sometimes referred to "domino" circuitry). Each of the dynamic logic circuits 200, 202 and 204 require a clock signal for operation. The dynamic logic circuit 200 performs a logic function on the input(s) DataIn and outputs DataOut1. The dynamic logic circuit 202 performs a logic function on the signal DataOut1 (and perhaps one or more additional input signals identified as DataIn1) and outputs DataOut2. The dynamic logic circuit 204 performs a logic function on the signal DataOut2 (and perhaps one or more additional input signals identified as DataIn2) and outputs DataOut3.

In some applications, it is desirable to have both the output signal and the complement of the output signal of a preceding stage of the cascaded dynamic logic circuits (for example, having the complement of DataOut1 input to the dynamic logic circuit 202 or the complement of DataOut2 input to the dynamic logic circuit 204) input to a particular dynamic logic circuit. In other words, some dynamic logic circuits require a dual-rail signal as an input. When both the output signal and its complement are needed for input to the next stage, the complement is typically generated by simply inverting the output by utilizing an inverter. However, there is a problem with inverting the output signal for input to the next successive stage in typical domino dynamic logic circuits.

Referring now to FIG. 3, there is illustrated a typical "domino" dynamic logic circuit 300, which in this example is a non-inverting buffer. An input signal to be evaluated is received at the gate electrode of an N-channel FET ("NFET") 312, while a P-channel FET ("PFET") 311 and an NFET 313 both receive a clock input at their gate electrodes (please note, NFETs are designated with the letter N in the FIGURES while PFETs are designated with the letter P). Referring to FIGS. 3 and 4 in combination, an important limitation of this type of dynamic logic circuit may be seen. Note that during the precharge phase, the clock input precharges a node 316 to a high level, and then during the evaluate phase, the dynamic logic circuit 300 evaluates the input signal received by the NFET 312 and outputs the evaluation through the optional half latch comprising a PFET 314 and an inverter 315.

The input signal may change in either direction during the first part of the precharge phase, and may change from a low level to a high level at the end of the precharge phase during the evaluate phase and still allow the logic circuit to output the correct output signal. However, during the evaluate phase, a change of the input signal from a high level to a low level will result in an output that may not be the correct output signal. The reason for this is that a changing input signal can cause the dynamic precharge of the node 316 to lose its high level precharge condition and not be able to recover this high level if the logical input conditions are such that this is the desired logical condition. In other words, if during the evaluate phase the input signal transitions from a high level to a low level, it is possible that the output of the dynamic logic circuit 300 may still be a high level even though this is not what is expected if the input signal is now at a low level.

This problem is more specifically stated as follows: during the evaluation phase, input signals may change if the change is from a low to a high, but may not change from a high to a low. This condition can occur when a "static signal" is fed into a dynamic logic circuit (i.e., the static signal is converted to dynamic timing). A typical "static signal" can be expected to change state almost anywhere within a timing cycle.

Accordingly, in a typical cascaded logic circuit as illustrated in FIG. 2, where the complement of the output signal of one of the dynamic logic circuits is needed as an input to another dynamic logic circuit, simply inverting the output signal to generate the complement may cause the dynamic logic circuit to falsely switch.

There exist two possible solutions to this problem, however, each of these solutions has its own disadvantages and may create additional problems. One possible solution is to delay the clock signal of the receiving stage in order to guarantee that the arrival of the clock signal is later than the data. However, delaying the clock requires the addition of clock skew generating circuits used to create the clock delay. Moreover, the addition of delay injects additional timing constraints on the logic circuit and overall data processing system.

The other possible solution involves the addition of duplicate circuitry to generate a complement signal when the complement is required to perform logic. This solution is illustrated in FIG. 5 using the cascaded dynamic logic circuits 200, 202 and 204 of FIG. 2. The dynamic logic circuit 204 includes a logic function that requires the complement of the output signal (DataOut2) from the dynamic logic circuit 202. To generate the complement of the DataOut2 signal, additional dynamic logic circuits 500 and 502 are required to generate the complement using the complements of the DataIn signal(s) and the DataOut1 signal(s). The major problem with this type of solution is the need for additional duplicate circuitry that may include a significant number of transistors and reduce available space on an integrated circuit.

Accordingly, there exists a need for a logic circuit that eliminates false switching in domino dynamic logic circuits caused by inadvertent voltage transitions on an input signal. Further, there is needed a logic circuit that allows for the generation of a complement signal from an output signal of a dynamic logic circuit using simple inversion means, and further allows for the use of the generated complement signal as an input to a dynamic logic circuit by reducing the potential for false switching caused by the complement signal. In addition, there is needed a logic circuit that performs the above functions without the need for clock skew or additional duplicate circuitry.

SUMMARY OF THE INVENTION

According to the present invention, there is provided a circuit for eliminating potential false switching caused by high to low transitions of an input signal. The circuit includes an inverting circuit coupled to a first input signal for generating and outputting a second signal. This second signal is the complement of the first input signal. The circuit further includes a logic circuit having a first n-channel FET receiving the second signal at its gate electrode and a p-channel FET also receiving the second signal by having its gate electrode coupled to the gate electrode of the n-channel FET. The circuit also includes an output resulting from the evaluation of the second signal by the logic function implemented by the logic circuit.

In another embodiment of the present invention, there is provided a logic circuit for eliminating potential false switching caused by high to low transitions of an input signal that is the complement of an output signal generated by a first logic circuit. The first logic circuit outputs a first output signal and an inverting circuit coupled to the first output signal generates and outputs a second signal that is the complement of the first output signal. The logic circuit further includes a second logic circuit having a first n-channel FET receiving the second signal at its gate electrode and a p-channel FET also receiving the second signal by having its gate electrode coupled to the gate electrode of the n-channel FET. The circuit also includes an output resulting from the evaluation of the second signal by the logic function implemented by the second logic circuit. In another embodiment, there is provided the above-described logic circuit within a data processing system that comprises a plurality of devices including a processor, a storage device, a random access memory, a display device, and an input device coupled together by a bus such that one of the plurality of devices includes the logic circuitry.

In yet another embodiment of the present invention, there is provided a logic circuit including circuitry operable for inverting an output signal from a dynamic logic circuit to generate a first input signal and circuitry operable for receiving the first input signal. Circuitry is provided that is operable for receiving a clock signal that causes the logic circuit to operate in alternating precharge and evaluate phases. The logic circuit also includes circuitry operable for evaluating the first input signal during the evaluate phase and circuitry operable for causing the logic circuit to correctly evaluate the first input signal when the first input signal switches from a high level to a low level during the evaluate phase.

The present invention eliminates any potentially false switching caused by high to low transitions of an input signal to a logic circuit, and further eliminates the need for duplicate circuitry or clock skew that is generally necessary to prevent such potentially false switching.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is made to the following description taken in conjunction with the accompanying drawings, wherein.

DETAILED DESCRIPTION OF THE INVENTION

Figure 1:
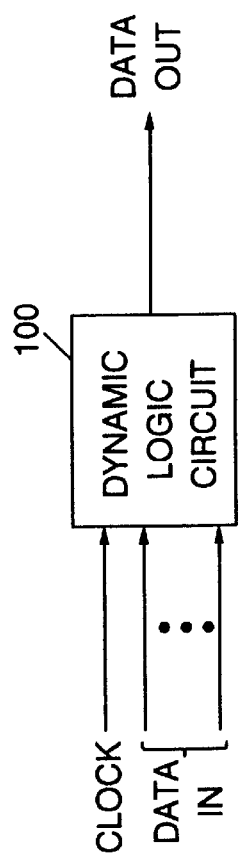
FIG. 1 is a block diagram of a prior art dynamic logic circuit that may implement a logic function.
Figure 2:
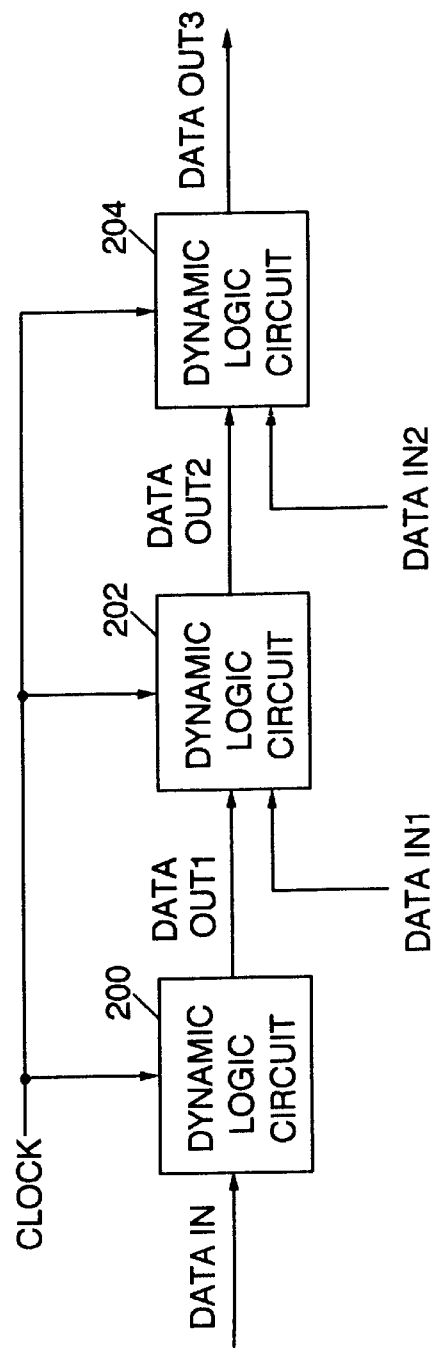
FIG. 2 is a block diagram of a typical cascaded (or "domino") dynamic logic circuit.
Figure 3:
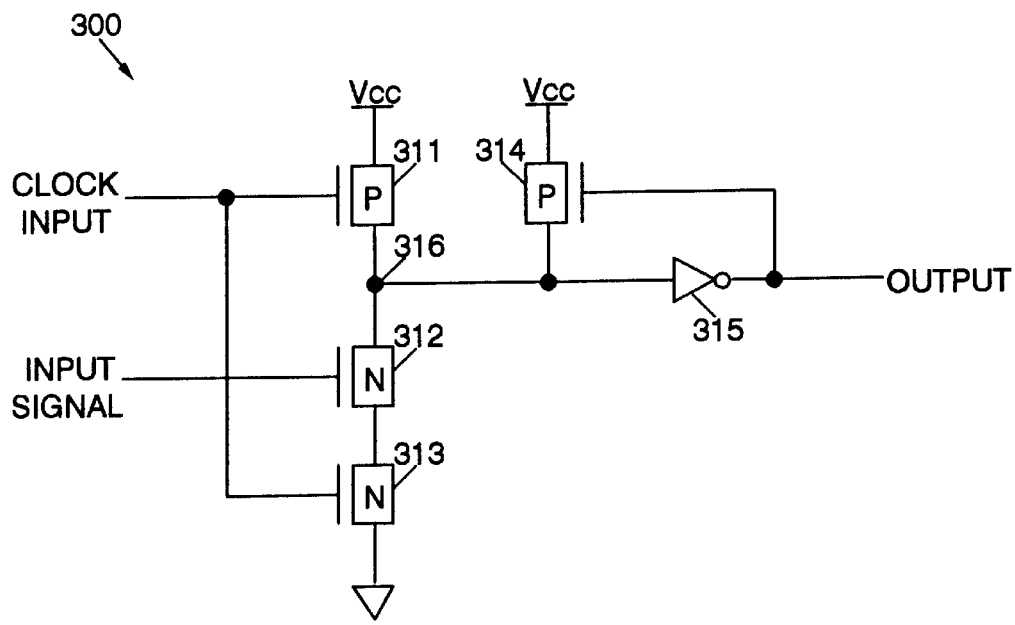
FIG. 3 illustrates a prior art dynamic logic circuit.
Figure 4:
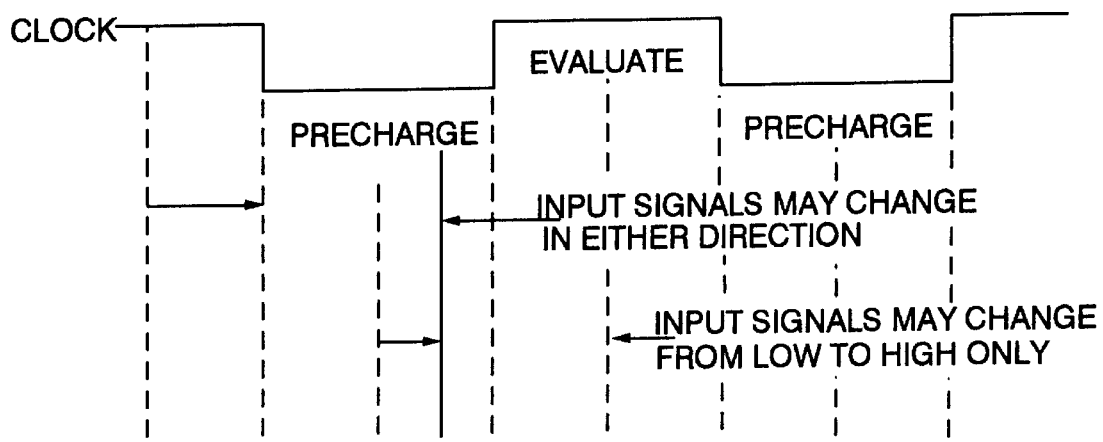
FIG. 4 illustrates the precharge and evaluate phases for the dynamic logic circuit illustrated in FIG. 1.
Figure 5:
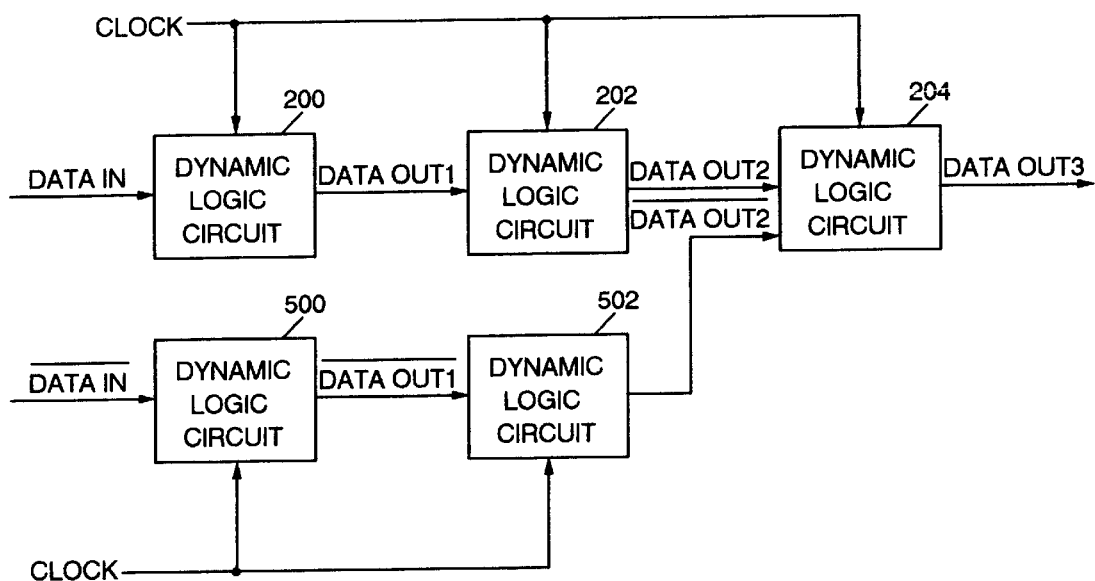
FIG. 5 is a block diagram of the cascaded dynamic logic circuit of FIG. 2 with additional duplicate circuitry for generating a complement signal.

With reference to the drawings, like reference characters designate like or similar parts throughout the drawings.

Figure 6:
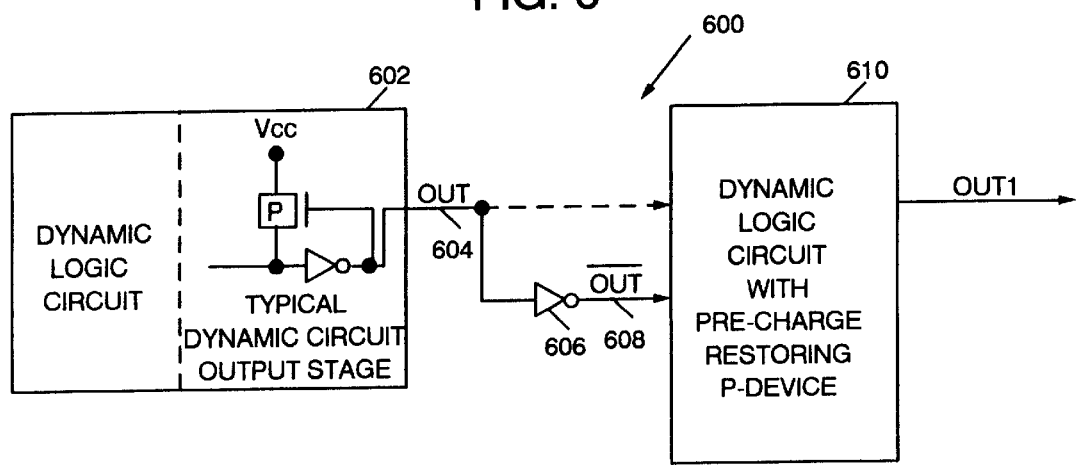
FIG. 6 is a logic circuit in accordance with the present invention.

Now referring to FIG. 6, there is shown a circuit 600 in accordance with the present invention. A logic circuit 602 outputs an output signal 604. As will be appreciated, the logic circuit 602 may be a dynamic logic circuit or any other type of logic circuit outputting an output signal 604. The output signal is input to an inverter 606 and inverted to generate an output signal 608. It will be understood that the output signal 608 is the complement of output signal 604. The output signal 608 is then input to a dynamic logic circuit 610 that implements a predetermined logic function that requires the complement of the output signal 604 of the logic circuit 602 as an input signal. To generate the complement of the output signal 604, the inverter 606 is used. As will be appreciated, depending on the logical function implemented, the dynamic logic circuit 610 may or may not require the output signal 604 as an input signal to the dynamic logic circuit 610 (see dashed line).

As described in the foregoing, utilization of an inverter to generate the required complement signal subjects the dynamic logic circuit 610 to potential false switching when the input signal (i.e., output signal 608) transitions from a high level to a low level during the evaluation phase. Such an event may occur because of the output stage of the logic circuit 602 or because the output signal 604 is a static signal. This output stage, illustrated in FIG. 6, precharges the output signal 604 to a low level during the precharge phase of the logic circuit 602. Meanwhile, the complement of output signal 604 (i.e., output signal 608) is at a high level during the precharge stage. Accordingly, the use of an inverter to generate the complement output signal creates a potential transition of the complement output signal that is input to the dynamic logic circuit 610 from a high level to a low level. Since the initial state of the complement signal is high, this high state of the complement signal may potentially discharge the precharged node in the dynamic logic circuit 610 during the evaluate phase. Therefore, the complement signal of the output signal 604 from the logic circuit 602 that is input to the dynamic logic circuit 610 must be treated as a static signal.

Utilization of a simple inversion of the output signal 604 to generate its complement may adversely affect circuit operation by creating a potential false switching problem as described. However, it would be advantageous to use an inverter to generate the complement of the output signal 604 because this would eliminate duplicate circuitry and/or addition of clock skew as described above. Accordingly, the present invention uses the inverter 606 to generate the complement 608 of the output signal 604 of the preceding logic circuit stage 602 and adds a pre-charge restoring p-device to the dynamic logic circuit 610 to eliminate any potential false switching caused by the use of the inverter 606. As will be appreciated, the dynamic logic circuit 610 may include any dynamic logic circuit for implementing a logical function that requires the complement of the output signal of another logic circuit.

Figure 7:
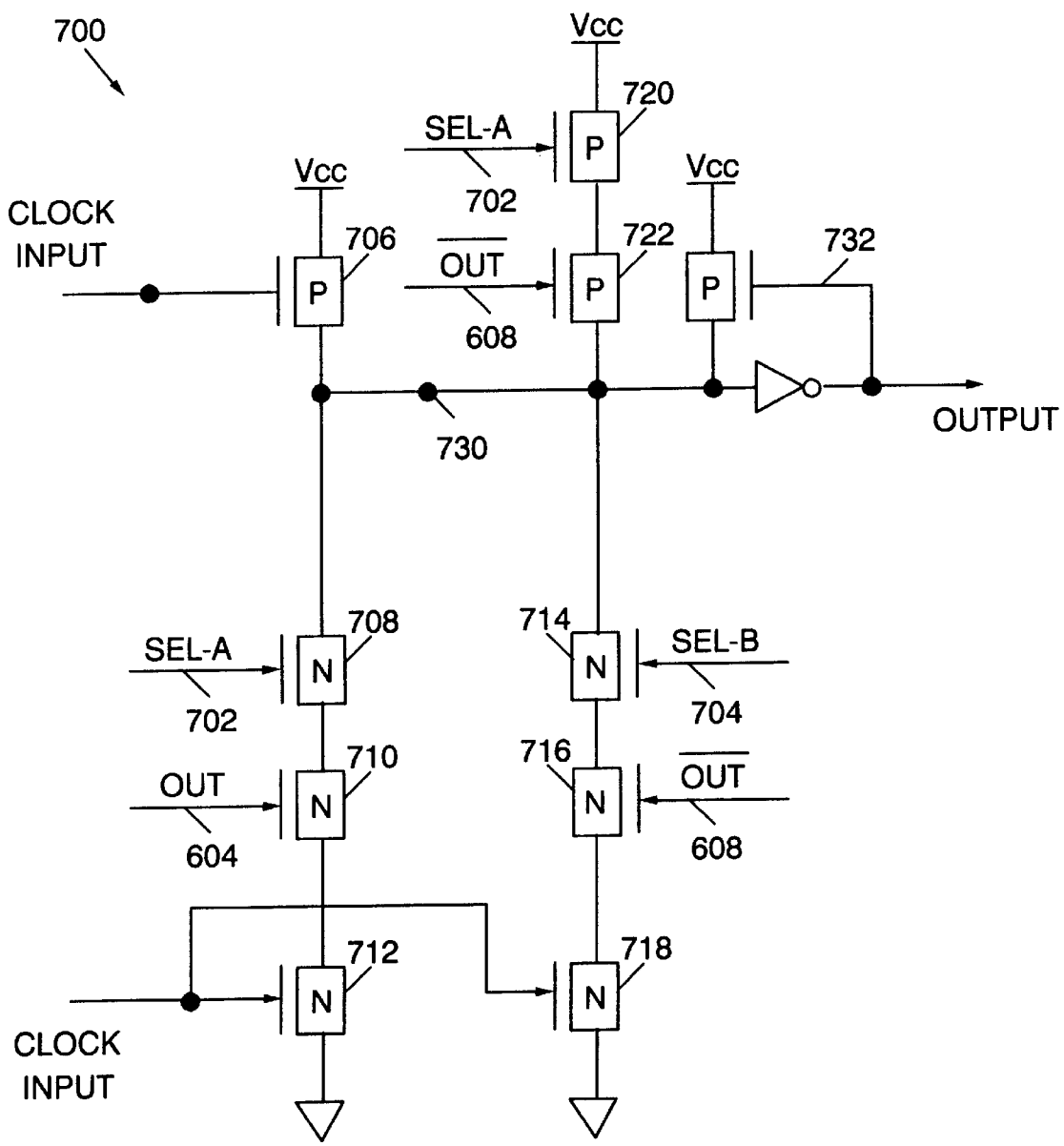
FIG. 7 is a more detailed schematic of a dynamic logic circuit in accordance with the present invention.

Now referring to FIG. 7, there is illustrated an example of a dynamic logic circuit 700 receiving the complement signal 608 of the output signal 604 from the logic circuit 602. The dynamic logic circuit 700 functions logically to select and output the value of a first input signal (output signal 604) or a second input signal (the output signal 608—the complement signal of output signal 604) based on the input signals 702 and 704 (SEL-A, SEL-B).

The dynamic logic circuit 700 includes a p-channel FET 706 coupled between a first voltage reference source (VCC) and a node 730, three n-channel FETs 708, 710 and 712 coupled in series between node 730 and a second voltage reference source (ground), three n-channel FETs 714, 716, and 718 coupled in series between node 730 and the second voltage reference source, a p-channel FET 720 and a p-channel FET 722 coupled between the VCC and the node 730, and an optional half latch 732 (which is comprised of a p-channel FET and an inverter) at the output of dynamic logic circuit 700. Note that the complement signal (static input signal) 608 is received by the gate electrode of the n-channel FET 716 and is also received by the gate electrode of the p-channel FET 722. The p-channel FET 722 allows the internal precharged node 730 to recover to a high or positive level when the clock input signal is at a high level and p-channel FET 706 is turned off. The result is that the static input signal may change state at the end of the precharge phase and well into the evaluation phase and still be able to recover the precharged high level at internal node 730.

As an example of what logic circuit 700 permits, if during the evaluate phase of logic circuit 700 the complement signal 608 switches from a high level to a low level (and signal 702 is low and signal 704 is high), then the desired and correct output level should be a low level. However, without the p-channel FET 722 this would not occur, since when the complement signal 608 changes from a high level to a low level, the node 730 has already been discharged to a low level through the n-channel FETs 714, 716, and 718 when the complement signal 608 was a high level at the beginning of the evaluate stage. However, with the inclusion of the p-channel FET 722, the low level of complement signal 608 arriving at the gate electrode of the p-channel FET 722 raises the voltage level of node 730 back to a high level. The high level is, in turn, inverted by the latch 732 to a low level, which is the correct output level under this condition.

For purposes of discussion herein, a static signal is not controlled by a clock edge (signal), while a dynamic signal is triggered by a clock signal edge. As will be appreciated, the output signal 604 is defined as a dynamic signal while its complement signal 608 is defined as a static signal.

Figure 8:
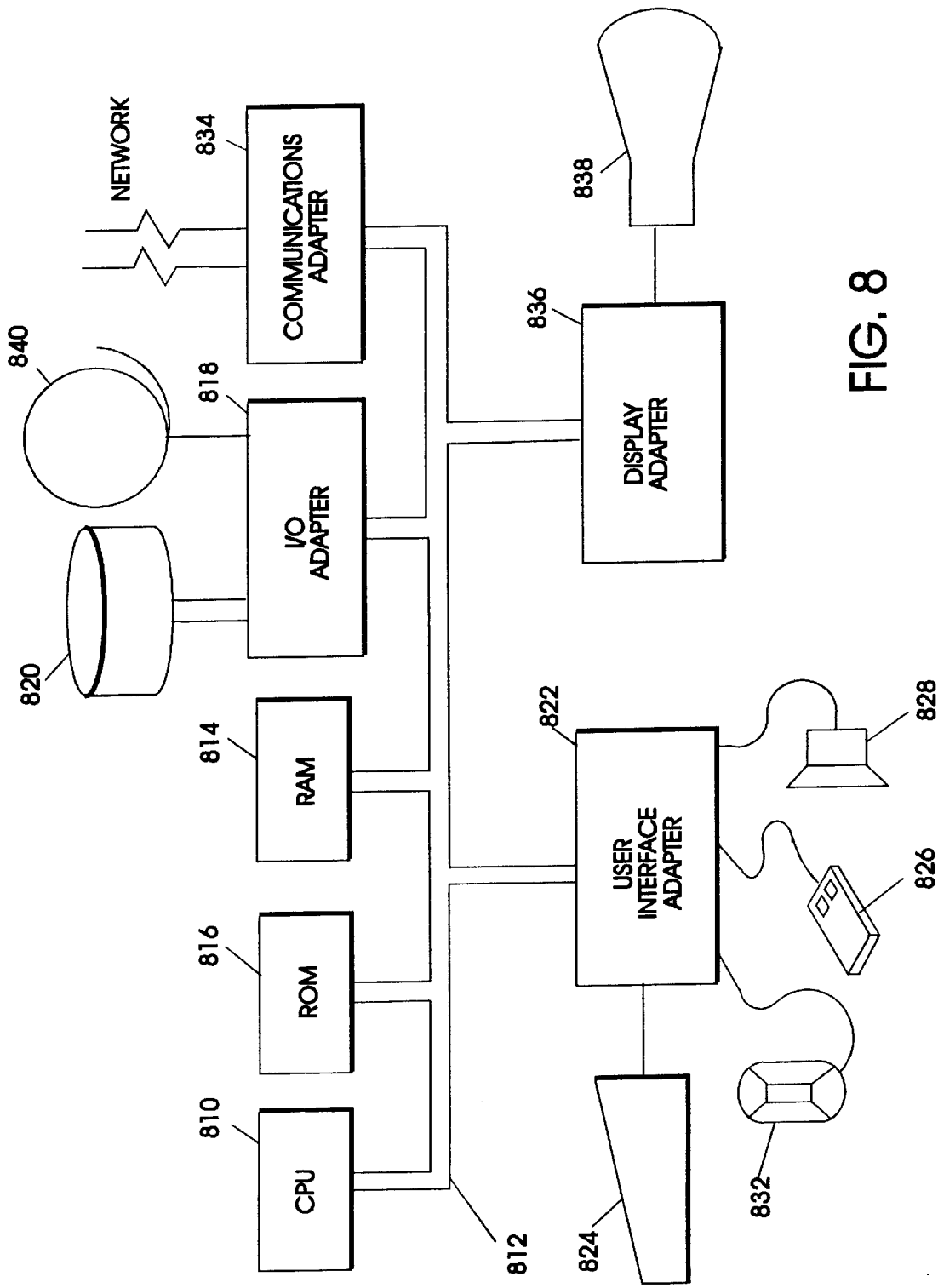
FIG. 8 is a block diagram illustrating a data processing system configured in accordance with the present invention.

A representative hardware environment for practicing the present invention is depicted in FIG. 8, which illustrates a typical hardware configuration of a workstation in accordance with the subject invention having a central processing unit (CPU) 810, such as a conventional microprocessor, and a number of other units interconnected via a system bus 812. The workstation shown in FIG. 8 includes a random access memory (RAM) 814, a read only memory (ROM) 816, an input/output (I/O) adapter 818 for connecting peripheral devices such as one or more disk units 820 and tape drives 840 to the bus 812, a user interface adapter 822 for connecting a keyboard 824, a mouse 826, a speaker 828, a microphone 832, and/or other user interface devices such as a touch screen device (not shown) to the bus 812, a communication adapter 834 for connecting the workstation to a data processing network, and a display adapter 836 for connecting the bus 812 to a display device 838. The CPU 810 may include other circuitry not shown herein, which will include circuitry commonly found within a microprocessor, e.g., execution unit, bus interface unit, arithmetic logic unit, etc. The CPU 810 may also reside on a single integrated circuit. Logic circuit 700 may be utilized within CPU 810, or any of the other components of the workstation.

Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

What is claimed is:

1. A circuit, comprising:
   an inverting circuit coupled to a first input signal for generating and outputting a second signal, the second signal is a complement of the first input signal;
   a logic circuit comprising,
      an output, and
      a first n-channel FET having a gate electrode, the first n-channel FET receiving the second signal at the gate electrode and operably coupling to the output,
      a first p-channel FET having a gate electrode, the gate electrode of the first p-channel FET coupled to the gate electrode of the first n-channel FET, the first p-channel FET coupled to the output;
   a second n-channel FET having a gate electrode, the second n-channel FET operable for receiving said first signal at the gate electrode, and wherein the second n-channel FET is coupled to the output, and wherein the first signal is a dynamic input signal; and a second p-channel FET having a gate electrode, the second p-channel FET operable for receiving a clock signal at the gate electrode and coupled to the output of the first logic circuit.

2. A circuit in accordance with claim 1 wherein the logic circuit is operable for outputting to the output an evaluation of the second signal.

3. A circuit in accordance with claim 1 wherein the second signal is a static signal.

4. A circuit in accordance with claim 1 wherein the first p-channel FET is coupled to a voltage reference.

5. A logic circuit, comprising:

a first logic circuit outputting a first output signal;

an inverting circuit coupled to the first output signal for generating and outputting a second signal, the second signal is a complement of the first output signal;

a second logic circuit comprising,
an output, and
a first n-channel FET having a gate electrode, the first n-channel FET receiving the second signal at the gate electrode and operably coupling to the output,
a first p-channel FET having a gate electrode, the gate electrode of the first p-channel FET coupled to the gate electrode of the first n-channel FET, the first p-channel FET coupled to the output;
a second n-channel FET having a gate electrode, the second n-channel FET operable for receiving said first output signal at the gate electrode, and wherein the second n-channel FET is coupled to the output, and wherein the first output signal is a dynamic input signal, wherein the first p-channel FET is coupled to a voltage reference; and a second p-channel FET having a gate electrode, the second p-channel FET operable for receiving a clock signal at the gate electrode and coupled to the output of the second logic circuit.

6. A circuit in accordance with claim 5 wherein the second logic circuit is operable for outputting to the output an evaluation of the second signal.

7. A logic circuit comprising:

first circuitry operable for inverting an output signal from a dynamic logic circuit to generate a first input signal;

second circuitry operable for receiving a clock signal that causes the logic circuit to operate in alternating precharge and evaluate phases;

third circuitry operable for receiving the first input signal and operable for evaluating the first input signal during the evaluate phase; and fourth circuitry receiving the first input signal and operable for causing the logic circuit to correctly evaluate the first input signal when the first input signal switches from a high level to a low level during the evaluate phase.

8. A logic circuit in accordance with claim 7 wherein the third circuitry operable for receiving the first input signal further receiving said output signal and operable for evaluating the first input signal and the output signal during the evaluate phase.

9. A logic circuit in accordance with claim 7 further comprising circuitry operable for outputting an evaluation of the first input signal, and wherein the fourth circuitry for causing the logic circuit to correctly evaluate comprises a FET.

10. A logic circuit in accordance with claim 7 wherein the second circuitry operable for receiving the clock signal comprises a first p-channel FET having a gate electrode operable for receiving the clock signal, the first p-channel FET coupled between a first voltage reference and a node, and wherein the third circuitry operable for evaluating is coupled to the node and comprises a first n-channel FET operable for receiving said first input signal and a second n-channel FET operable for receiving a said output signal, and wherein the fourth circuitry operable for causing comprises a second p-channel FET having a gate electrode operable for receiving the first input signal, the second p-channel FET coupled between the node and the first voltage reference.

11. A data processing system comprising a plurality of devices including a processor, a storage device, a random access memory, a display device, and an input device coupled together by a bus and wherein one of the plurality of devices comprises logic circuitry comprising:

a first logic circuit outputting a first output signal wherein said first output signal is a dynamic input signal;

an inverting circuit coupled to the first output signal for generating and outputting a second signal, the second signal is a complement of the first output signal; and a second logic circuit comprising,
an output, and
a first n-channel FET having a gate electrode, the first n-channel FET receiving the second signal at the gate electrode and operably coupling to the output,
a first p-channel FET having a gate electrode, the gate electrode of the first p-channel FET coupled to the gate electrode of the first n-channel FET, the first p-channel FET coupled to the output and wherein the second signal is a static signal;
a second p-channel FET operable for receiving a clock signal at its gate electrode, the first p-channel FET coupled between a voltage reference and the output node.

12. A data processing system in accordance with claim 11 further comprising a second n-channel FET having a gate electrode operable for receiving said dynamic input signal, the second n-channel FET coupled to the output.

13. The data processing system in accordance with claim 12 further comprising an output latch circuit coupled to the output.

* * * * *